(12) United States Patent
Li et al.

(10) Patent No.: US 7,270,694 B2
(45) Date of Patent: Sep. 18, 2007

(54) STABILIZED SILVER NANOPARTICLES AND THEIR USE

(75) Inventors: Yuning Li, Mississauga (CA); Yiliang Wu, Mississauga (CA); Beng S. Ong, Mississauga (CA)

(73) Assignee: Xerox Corporation, Stamford, CT (US)

( * ) Notice: Subject to any disclaimer, the term of this patent is extended or adjusted under 35 U.S.C. 154(b) by 276 days.

(21) Appl. No.: 10/958,937

(22) Filed: Oct. 5, 2004

(65) Prior Publication Data

US 2006/0073667 A1    Apr. 6, 2006

(51) Int. Cl.
*B22F 9/24* (2006.01)
(52) U.S. Cl. .............................. 75/351; 75/362; 75/371; 977/896; 977/932
(58) Field of Classification Search .................. 75/351, 75/362, 371
See application file for complete search history.

(56) References Cited

U.S. PATENT DOCUMENTS

| | | | |
|---|---|---|---|
| 5,147,841 A | 9/1992 | Wilcoxon | 502/173 |
| 6,103,868 A | 8/2000 | Heath et al. | 528/482 |
| 6,572,673 B2 | 6/2003 | Lee et al. | 75/362 |
| 6,660,058 B1 * | 12/2003 | Oh et al. | 75/351 |
| 6,688,494 B2 | 2/2004 | Pozarnsky et al. | 222/4 |
| 6,878,184 B1 * | 4/2005 | Rockenberger et al. | 75/343 |
| 2004/0247690 A1 * | 12/2004 | Yang | 424/490 |

OTHER PUBLICATIONS

Yiliang Wu et al., U.S. Appl. No. 10/733,136, filed Dec. 11, 2003, titled "Nanoparticle Deposition Process."

G. Blanchet and J. Rodgers, "Printed Techniques for Plastic Electronics", *Journal of Imaging Science and Technology*, vol. 47, No. 4, pp. 296-303 (Jul./Aug. 2003).

P. Buffat and J-P. Borel, "Size effect on the melting temperature of gold particles", *Physical Review A*, vol. 13, No. 6, pp. 2287-2298 (Jun. 1976).

C. Hayashi, "Ultrafine Particles", *J. Vacuum Sci. Technol. A*, vol. 5, No. 4, pp. 1375-1384 (Jul./Aug. 1987).

S. B. Fuller, E. J. Wilhelm, and J. M. Jacobson, "Ink-Jet Printed Nanoparticle Microelectromechanical Systems", *Journal of Microelectromechanical Systems*, vol. 11, No. 1, pp. 54-60 (Feb. 2002).

X. Z. Lin, X. Teng, and H. Yang, "Direct Synthesis of Narrowly Dispersed Silver Nanoparticles Using a Single-Source Precursor", *Langmuir*, vol. 19, pp. 10081-10085 (published on web Nov. 1, 2003).

H, Hiramatsu and F. E. Osterloh, "A Simple Large-Scale Synthesis of Nearly Monodisperse Gold and Silver Nanoparticles with Adjustable Sizes and with Exchangeable Surfactants", *Chem. Mater.*, vol. 16, No. 13, pp. 2509-2511 (Jun. 29, 2004; published on web May 28, 2004).

* cited by examiner

*Primary Examiner*—George P. Wyszomierski
(74) *Attorney, Agent, or Firm*—Zosan Soong

(57) ABSTRACT

A process comprising: reacting a silver compound with a reducing agent comprising a hydrazine compound in the presence of a thermally removable stabilizer in a reaction mixture comprising the silver compound, the reducing agent, the stabilizer, and an optional solvent, to form a plurality of silver-containing nanoparticles with molecules of the stabilizer on the surface of the silver-containing nanoparticles.

21 Claims, 2 Drawing Sheets

STABILIZED SILVER NANOPARTICLES AND THEIR USE

STATEMENT REGARDING FEDERALLY SPONSORED RESEARCH OR DEVELOPMENT

This invention was made with United States Government support under Cooperative Agreement No. 70ANBOH3033 awarded by the National Institute of Standards and Technology (NIST). The United States Government has certain rights in the invention.

CROSS-REFERENCE TO RELATED APPLICATIONS

Yiliang Wu et al., U.S. application Ser. No. 10/733,136 filed Dec. 11, 2003, titled "NANOPARTICLE DEPOSITION PROCESS."

BACKGROUND OF THE INVENTION

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, etc. However the deposition and/or patterning of functional electrodes, pixel pads, and conductive traces, lines and tracks which meet the conductivity, processing, and cost requirements for practical applications have been a great challenge. Silver is of particular interest as conductive elements for electronic devices because silver is much lower in cost than gold and it possesses much better environmental stability than copper. There is therefore a critical need, addressed by embodiments of the present invention, for lower cost methods for preparing liquid processable, stable silver-containing nanoparticle compositions that are suitable for fabricating electrically conductive elements of electronic devices.

The following documents provide background information:

Pozarnsky et al., U.S. Pat. No. 6,688,494.

Lee et al., U.S. Pat. No. 6,572,673 discloses hydrazide as a reducing agent at for example column 1, lines 52-53.

Heath et al., U.S. Pat. No. 6,103,868.

Wilcoxon, U.S. Pat. No. 5,147,841 discloses hydrazine as a reducing agent at for example column 4, line 44.

G. Blanchet and J. Rodgers, "Printed Techniques for Plastic Electronics", *Journal of Imaging Science and Technology*, Vol. 47, No. 4, pp. 296-303 (July/August 2003).

P. Buffat and J-P. Borel, "Size effect on the melting temperature of gold particles", *Physical Review* A, Vol., 13, No. 6, pp. 2287-2298 (June 1976).

C. Hayashi, "Ultrafine Particles", *J. Vacuum Sci. Technol.* A, Vol. 5, No. 4, pp. 1375-1384 (July/August 1987).

S. B. Fuller, E. J. Wilhelm, and J. M. Jacobson, "Ink-Jet Printed Nanoparticle Microelectromechanical Systems", *Journal of Microelectromechanical Systems*, Vol. 11, No. 1, pp. 54-60 (February 2002).

X. Z. Lin, X. Teng, and H. Yang, "Direct Synthesis of Narrowly Dispersed Silver Nanoparticles Using a Single-Source Precursor", *Langmuir*, Vol. 19, pp. 10081-10085 (published on web Nov. 1, 2003).

H. Hiramatsu and F. E. Osterloh, "A Simple Large-Scale Synthesis of Nearly Monodisperse Gold and Silver Nanoparticles with Adjustable Sizes and with Exchangeable Surfactants", *Chem. Mater.*, Vol. 16, No. 13, pp. 2509-2511 (Jun. 29, 2004; published on web May 28, 2004).

SUMMARY OF THE DISCLOSURE

In embodiments, there is provided a process comprising: reacting a silver compound with a reducing agent comprising a hydrazine compound in the presence of a thermally removable stabilizer in a reaction mixture comprising the silver compound, the reducing agent, the stabilizer, and an optional solvent, to form a plurality of silver-containing nanoparticles with molecules of the stabilizer on the surface of the silver-containing nanoparticles.

In further embodiments, there is provided a process comprising:
  (a) reacting a silver compound with a reducing agent comprising a hydrazine compound in the presence of a thermally removable stabilizer in a reaction mixture comprising the silver compound, the reducing agent, the stabilizer, and an optional solvent, to form a plurality of silver-containing nanoparticles with molecules of the stabilizer on the surface of the silver-containing nanoparticles;
  (b) isolating the plurality of silver-containing nanoparticles with the molecules of the stabilizer on the surface of the silver-containing nanoparticles; and
  (c) preparing a composition including a liquid and the plurality of silver-containing nanoparticles with molecules of the stabilizer on the surface of the silver-containing nanoparticles.

In other embodiments, there is provided a process comprising:
  (a) depositing a composition comprising a liquid and a plurality of silver-containing nanoparticles with a stabilizer on a substrate by a liquid deposition technique to form a deposited composition, wherein the silver-containing nanoparticles are obtained by reacting a silver compound with a reducing agent comprising a hydrazine compound in the presence of a thermally removable stabilizer in a reaction mixture comprising the silver compound, the reducing agent, the stabilizer, and an optional solvent; and
  (b) heating the deposited composition to form an electrically conductive layer comprising silver.

There is further provided in embodiments, a composition comprising a liquid and a plurality of silver-containing nanoparticles with a stabilizer, wherein the silver-containing nanoparticles are a product of a reaction of a silver compound with a reducing agent comprising a hydrazine compound in the presence of a thermally removable stabilizer in a reaction mixture comprising the silver compound, the reducing agent, the stabilizer, and an optional solvent.

In additional embodiments, there is provided an electronic device comprising in any suitable sequence:
  a substrate;
  an optional insulating layer or an optional semiconductor layer, or both the optional insulating layer and the optional semiconductor layer; and
  an electrically conductive element of the electronic device, wherein the electrically conductive element comprises annealed silver-containing nanoparticles, wherein the silver-containing nanoparticles are a product of a reaction of a silver compound with a reducing agent comprising a hydrazine compound in the presence of a thermally removable stabilizer in a reaction mixture comprising the silver compound, the reducing agent, the stabilizer, and an optional solvent.

In more embodiments, there is provided a thin film transistor circuit comprising an array of thin film transistors including electrodes, connecting conductive lines and conductive pads, wherein the electrodes, the connecting conductive lines, or the conductive pads, or a combination of any two or all of the electrodes, the connecting conductive lines and the conductive pads comprise annealed silver-containing nanoparticles, wherein the silver-containing nanoparticles are a product of a reaction of a silver compound with a reducing agent comprising a hydrazine compound in the presence of a thermally removable stabilizer in a reaction mixture comprising the silver compound, the reducing agent, the stabilizer, and an optional solvent.

In yet other embodiments, there is provided a thin film transistor comprising:

(a) an insulating layer;
(b) a gate electrode;
(c) a semiconductor layer;
(d) a source electrode; and
(e) a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, and wherein at least one of the source electrode, the drain electrode, and the gate electrode comprises annealed silver-containing nanoparticles, wherein the silver-containing nanoparticles are a product of a reaction of a silver compound with a reducing agent comprising a hydrazine compound in the presence of a thermally removable stabilizer in a reaction mixture comprising the silver compound, the reducing agent, the stabilizer, and an optional solvent.

BRIEF DESCRIPTION OF THE DRAWINGS

Other aspects of the present invention will become apparent as the following description proceeds and upon reference to the following figures which represent exemplary embodiments.

Unless otherwise noted, the same reference numeral in different Figures refers to the same or similar feature.

DETAILED DESCRIPTION

Suitable silver compounds include organic and inorganic silver compounds. In embodiments, the silver compounds include silver acetate, silver carbonate, silver nitrate, silver perchlorate, silver phosphate, silver trifluoroacetate, silver benzoate, silver lactate, and the like, or mixtures thereof in any suitable ratio.

The reducing agent for the silver compounds includes a hydrazine compound. The hydrazine compound includes hydrazine and any suitable derivatives (substituted at one or both nitrogen atoms where each nitrogen atom can be substituted one or two times with the same or different substituent), as well as salts and hydrates of hydrazine and salts and hydrates of the hydrazine derivatives. It is understood that the exemplary compounds described herein for the hydrazine compound also include the hydrate form where applicable. For example, the compound "hydrazine" includes hydrazine hydrate and hydrazine not in hydrated form. Exemplary examples of the hydrazine compound are as follows:

Hydrazine ($H_2HNH_2$);

Hydrazine salt such as for example hydrazine acid tartrate, hydrazine monohydrobromide, hydrazine monohydrochloride, hydrazine dichloride, hydrazine monooxalate, and hydrazine sulfate.

Hydrocarbyl hydrazine (e.g., $RNHNH_2$ and RNHNHR and $RRNNH_2$) where one nitrogen atom is mono- or di-substituted with R, and the other nitrogen atom is optionally mono- or di-substituted with R, where each R is an independently selected hydrocarbon group such as methyl ethyl, propyl, butyl, hydroxyethyl, phenyl, benzyl, tolyl, bromophenyl, chloropehnyl, nitrophenyl, xylyl, and the like. Illustrative examples of hydrocarbyl hydrazine include for example, methylhydrazine, tert-butylhydrazine, 2-hydroxyethylhydrazine, benzylhydrazine, phenylhydrazine, tolylhydrazine, bromophenylhydrazine, chlorophenylhydrazine, nitrophenylhydrazine, 1,1-dimethylhydrazine, 1,1-diphenylhydrazine, 1,2-diethylhydrazine, and 1,2-diphenylhydrazine.

Hydrocarbyl hydrazine salt (which is a salt of the hydrocarbyl hydrazine described herein) such as for example methylhydrazine hydrochloride, phenylhydrazine hydrochloride, benzylhydrazine oxalate, butylhydrazine hydrochloride, butylhydrazine oxalate salt, and propylhydrazine oxalate salt.

Hydrazide (e.g., $RC(O)NHNH_2$ and RC(O)NHNHR' and RC(O)NHNHC(O)R) where one or both nitrogen atoms are substituted by an acyl group of formula RC(O), where each R is independently selected from hydrogen and a hydrocarbon group, and one or both nitrogen atoms are optionally mono- or di-substituted with R', where each R' is an independently selected hydrocarbon group. Illustrative examples of hydrazide are for example, formic hydrazide, acethydrazide, benzhydrazide, adipic acid dihydrazide, carbohydrazide, butanohydrazide, hexanoic hydrazide, octanoic hydrazide, oxamic acid hydrazide, maleic hydrazide, N-methylhydrazinecarboxamide, and semicarbazide.

Carbazate (or hydrazinocarboxylate) (e.g., ROC(O)NHNHR' and $ROC(O)NHNH_2$ and ROC(O)NHNHC(O)OR) where one or both nitrogen atoms are substituted by an ester group of formula ROC(O), where each R is independently selected from hydrogen and a hydrocarbon group, and one or both nitrogen atoms are optionally mono- or di-substituted with R', where each R' is an independently selected hydrocarbon group. Illustrative examples of carbazate are for example, methyl carbazate (methyl hydrazinocarboxylate), ethyl carbazate, butyl carbazate, benzyl carbazate, and 2-hydroxyethyl carbazate.

Sulfonohydrazide (e.g., $RSO_2NHNH_2$, $RSO_2NHNHR'$, and $RSO_2NHNHSO_2R$) where one or both nitrogen atoms are substituted by a sulfonyl group of formula $RSO_2$, where each R is independently selected from hydrogen and a hydrocarbon group, and one or both nitrogen atoms are optionally mono- or di-substituted with R', where each R' is an independently selected hydrocarbon group. lullustraive examples of sulfonohydrazide are for example, methanesulfonohydrazide, benzenesulfonohydrazine, 2,4,6-trimethylbenzenesulfonohydrazide, and p-toluenesulfonohydrazide.

Other exemplary hydrazine compounds are for example hydrazine acetate, aminoguanidine, thiosemicarbazide, methyl hydrazinecarbimidothiolate, and thiocarbohydrazide.

Unless otherwise indicated, in identifying the substituents for R and R' of the various hydrazine compounds, the phrase "hydrocarbon group" encompasses both unsubstituted hydrocarbon groups and substituted hydrocarbon groups. Unsubstituted hydrocarbon groups may be for example a straight chain alkyl group, a branched alkyl group, a cycloalkyl group, an aryl group, an alkylaryl group, and an arylalkyl group. Exemplary alkyl groups include for example methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomeric forms thereof. Substituted hydrocarbon groups may be the unsubstituted hydrocarbon groups described herein which are substituted one, two or more times with for example a halogen (chlorine, bromine, fluorine, and iodine), nitro, cyano, an alkoxy group (e.g., methoxyl, ethoxyl, and propoxy), or a mixture thereof. In embodiments, the hydrocarbon group may be optionally substituted alkyl and optionally substituted aryl.

In embodiments, the hydrazine compound is other than a hydrazine and a hydrazine salt; in other embodiments, the hydrazine compound is other than a hydrazide; and in further embodiments, the hydrazine compound is other than a hydrazine, a hydrazine salt, and a hydrazide.

One, two, three or more reducing agents may be used. In embodiments where two or more reducing agents are used, each reducing agent may be present at any suitable weight ratio or molar ratio such as for example from about 99(first reducing agent):1(second reducing agent) to about 1(first reducing agent):99(second reducing agent). The amount of reducing agent used in the embodiments of the present invention is for example about 0.25 molar equivalent or more per mole of silver compound.

Any suitable stabilizer may be used which has the function of minimizing or preventing the silver-containing nanoparticles from aggregation in a liquid and optionally providing the solubility or dispersibility of silver-containing nanoparticles in a liquid. In addition, the stabilizer is thermally removable which means that the stabilizer can be caused to dissociate from the silver-containing nanoparticle surface under certain conditions such as through heating. The heating may be accomplished to a certain temperature such as for example below about 250 degree C., or below about 200 degree C., under normal atmospheric conditions or at a reduced pressure of for example from several mbars to about $10^{-3}$ mbar. The thermal dissociation of the stabilizer from the silver-containing nanoparticles at a temperature such as for example lower than about 250 degree C. may result in the evaporation of the stabilizer or decomposition of the stabilizer into gaseous forms.

In embodiments, the stabilizer may be an organic stabilizer. The term "organic" in "organic stabilizer" refers to the presence of carbon atom(s), but the organic stabilizer may include one or more non-metal heteroatoms such as nitrogen, oxygen, sulfur, silicon, halogen, and the like. Exemplary organic stabilizers include for instance thiol and its derivatives, amine and its derivatives, carboxylic acid and its carboxylate derivatives, polyethylene glycols, and other organic surfactants. In embodiments, the organic stabilizer is selected from the group consisting of a thiol such as for example butanethiol, pentanethiol, hexanethiol, heptanethiol, octanethiol, decanethiol, and dodecanethiol; an amine such as for example ethylamine, propylamine, butylamine, penylamine, hexylamine, heptylamine, octylamine, nonylamine, decylamine, and dodecylamine; a dithiol such as for example 1,2-ethanedithiol, 1,3-propanedithiol, and 1,4-butanedithiol; a diamine such as for example ethylenediamine, 1,3-diaminopropane, 1,4-diaminobutane; a mixture of a thiol and a dithiol; and a mixture of an amine and a diamine. Organic stabilizers containing a pyridine derivative (e.g., dodecyl pyridine) and/or organophosphine that can stabilize silver-containing nanoparticles are also included as a stabilizer in embodiments of the present invention.

In embodiments, the stabilizer is an organoamine such as for example butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and the like, or mixtures thereof.

One, two, three or more stabilizers may be used. In embodiments where two or more stabilizers are used, each stabilizer may be present at any suitable weight ratio or molar ratio such as for example from about 99(first stabilizer):1(second stabilizer) to about 1(first stabilizer):99(second stabilizer). The amount of the stabilizer used is for example about 1 or more molar equivalents per mole of silver compound, or about 2 or more molar equivalents per mole of silver compound, or about 10 or more molar equivalents per mole of silver compound, or about 25 or more molar equivalents per mole of silver compound.

In embodiments, the silver-containing nanoparticles may form a chemical bond with the stabilizer. The chemical names of the stabilizer provided herein are before formation of any chemical bond with the silver-containing nanoparticles. It is noted that the nature of the stabilizer may change with the formation of a chemical bond, but for convenience the chemical name prior to formation of the chemical bond is used.

The attractive force between the silver-containing nanoparticles and the stabilizer can be a chemical bond and/or physical attachment. The chemical bond can take the form of for example covalent bonding, hydrogen bonding, coordination complex bonding, or ionic bonding, or a mixture of different chemical bondings. The physical attachment can take the form of for example van der Waals' forces or dipole-dipole interaction, or a mixture of different physical attachments.

The extent of the coverage of stabilizer on the surface of the silver-containing nanoparticles can vary for example from partial to full coverage depending for instance on the capability of the stabilizer to stabilize the silver-containing nanoparticles in the solvent. Of course, there is variability as well in the extent of coverage of the stabilizer among the individual silver-containing nanoparticles.

Any suitable solvent can be used for the reaction mixture including for example organic solvents and/or water. The organic solvents include for example hydrocarbon solvents such as pentane, hexane, cyclohexane, heptane, octane, nonane, decane, undecane, dodecane, tridecane, tetradecane, toluene, xylene, mesitylene, and the like; alcohols such as methanol, ethanol, propanol, butanol, pentanol and the like;

tetrahydrofuran; chlorobenzene; dichlorobenzene; trichlorobenzene; nitrobenzene; cyanobenzene; acetonitrile; and mixtures thereof. One, two, three or more solvents may be used. In embodiments where two or more solvents are used, each solvent may be present at any suitable volume ratio or molar ratio such as for example from about 99(first solvent):1(second solvent) to about I(first solvent):99(second solvent).

The reaction of the silver compound with the reducing agent is carried out at a suitable temperature of for example from about −50° C. to about 200° C., or from about 0° C. to about 150° C., particularly at a temperature ranging for example from about 20° C. to about 120° C.

The silver-containing nanoparticles have a particle size of for example less than about 100 nm, less than about 50 nm, less than about 25 nm, or less than about 10 nm. The particle size is defined herein as the average diameter of silver-containing particle core, excluding the stabilizer, as determined by transmission electron microscopy ("TEM"). Generally, a plurality of particle sizes may exist in the silver-containing nanoparticles obtained from the preparation. In embodiments, the existence of different sized silver-containing nanoparticles is acceptable.

In embodiments, the silver-containing nanoparticles are composed of elemental silver or a silver composite. Besides silver, the silver composite includes either or both of (i) one or more other metals and (ii) one or more non-metals. Suitable other metals include for example Al, Au, Pt, Pd, Cu, Co, Cr, In, and Ni, particularly the transition metals for example Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include for example Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising for example at least about 20% of the nanoparticles by weight, particularly greater than about 50% of the nanoparticles by weight. Unless otherwise noted, the weight percentages recited herein for the components of the silver-containing nanoparticles do not include the stabilizer.

Silver-containing nanoparticles composed of a silver composite can be made for example by using a mixture of (i) a silver compound (or compounds) and (ii) another metal salt (or salts) or another non-metal (or non-metals) in the reaction.

The preparation of silver-containing nanoparticle compositions, which are suitable for the preparation of conductive elements for electronic applications can be carried out using all or some of the following procedures: (i) addition of a scavenger to the final reaction mixture from the preparation of silver-containing nanoparticles to destroy excess reducing agent; (ii) concentrating the reaction mixture by removing solvent; (iii) adding the concentrated reaction mixture to a non-solvent (or vice versa) to precipitate the silver-containing nanoparticles; (iv) collecting the silver-containing nanoparticles by filtration or centrifugation to result in isolated silver-containing nanoparticles (with the stabilizer molecules on the surface of the silver-containing nanoparticles); (v) dissolving or dispersing (assisted by for example ultrasonic and/or mechanical stirring) the isolated silver-containing nanoparticles (with molecules of the stabilizer on the surface of the silver-containing nanoparticles) in an appropriate liquid.

Silver-containing nanoparticle compositions can also be made by mixing silver-containing nanoparticles with other metal or non-metal nanoparticles.

In embodiments, it may be possible to form a silver-containing nanoparticle composition (with stabilizer molecules on the surface of the silver-containing nanoparticles) suitable for forming conductive elements for electronic applications without the need for the above described procedures to isolate the silver-containing nanoparticles from the reaction mixture. In such embodiments, the reaction mixture (optionally augmented with another liquid which may be the same or different from the solvent used in the reaction mixture) may be considered the silver-containing nanoparticle composition.

The scavengers that can be used to destroy excess reducing agent include for example ketone, aldehyde, carboxylic acid, or a mixture thereof. Specific exemplary scavengers include acetone, butanone, pentanone, formaldehyde, acetaldehyde, acetic acid, and the like, or a mixture thereof.

Suitable non-solvents that can be used for the precipitation of silver-containing nanoparticles include any liquids that are mixable with the reaction solvent or solvents for the preparation of silver-containing nanoparticles.

The liquid that can be used to disperse or dissolve silver-containing nanoparticles to form a silver-containing nanoparticle composition includes organic liquids or water. The organic liquids include for example hydrocarbon solvents such as pentane, hexane, cyclohexane, heptane, octane, nonane, decane, undecane, dodecane, tridecane, tetradecane, toluene, xylene, mesitylene, and the like; alcohols such as methanol, ethanol, propanol, butanol and the like; tetrahydrofuran; chlorobenzene; dichlorobenzene; trichlorobenzene; nitrobenzene; cyanobenzene; acetonitrile; and mixtures thereof. One, two, three or more liquids may be used. In embodiments where two or more solvents are used, each solvent may be present at any suitable volume ratio or molar ratio such as for example from about 99(first liquid):1(second liquid) to about 1(first liquid):99(second liquid).

Exemplary amounts of the components of the silver-containing nanoparticle composition are as follows. The silver-containing nanoparticles and the stabilizer are present in an amount ranging for example from about 0.3% to about 90% by weight, or from about 1% to about 70% by weight, the balance being the other components of the composition such as the liquid.

In embodiments, the stabilizer present in the silver-containing nanoparticle composition originated from the reaction mixture for the preparation of silver-containing nanoparticles; no stabilizer is added subsequently for the formation of the silver-containing nanoparticles. In other embodiments, the same or different stabilizer may be added subsequently for the formation of the silver-containing nanoparticles in an amount ranging for example from about 0.3% to about 70% by weight based on the weight of the silver-containing nanoparticle composition.

The silver-containing nanoparticle composition has a stability (that is, the time period where there is minimal precipitation or aggregation of the silver-containing nanoparticles) of for example at least about 3 hours, or from about 3 hours to about 1 month, from about 1 day to about 3 months, from about 1 day to about 6 months, from about 1 week to over 1 year.

The fabrication of an electrically conductive element from the silver-containing nanoparticle composition ("composition") can be carried out by depositing the composition on a substrate using a liquid deposition technique at any suitable time prior to or subsequent to the formation of other optional layer or layers on the substrate. Thus, liquid deposition of the composition on the substrate can occur either on a substrate or on a substrate already containing layered material (e.g., a semiconductor layer and/or an insulating layer).

The phrase "liquid deposition technique" refers to deposition of a composition using a liquid process such as liquid coating or printing, where the liquid is a solution or a dispersion. The silver-containing nanoparticle composition may be referred to as an ink when printing is used. Illustrative liquid coating processes include for example spin coating, blade coating, rod coating, dip coating, and the like. Illustrative printing techniques include for example lithography or offset printing, gravure, flexography, screen printing, stencil printing, inkjet printing, stamping (such as microcontact printing), and the like. Liquid deposition deposits a layer of the composition having a thickness ranging from about 5 nanometers to about 5 millimeters, preferably from about 10 nanometers to about 1000 micrometers. The deposited silver-containing nanoparticle composition at this stage may or may not exhibit appreciable electrical conductivity.

As used herein, the term "heating" encompasses any technique(s) that can impart sufficient energy to the heated material to cause the desired result such as thermal heating (e.g., a hot plate, an oven, and a burner), infra-red ("IR") radiation, microwave radiation, or UV radiation, or a combination thereof.

Heating the deposited composition at a temperature of for example below about 250° C., or below about 200° C. or about 150° C., causes the silver-containing nanoparticles to form an electrically conductive layer which is suitable for use as an electrically conductive element in electronic devices. The heating temperature preferably is one that does not cause adverse changes in the properties of previously deposited layer(s) or the substrate (whether single layer substrate or multilayer substrate). The heating is performed for a time ranging from for example about 1 second to about 10 hours, particularly from about 10 seconds to about 1 hour. The heating is performed in air, in an inert atmosphere for example under nitrogen or argon, or in a reducing atmosphere for example under nitrogen containing from about 1 to about 20 percent by volume hydrogen. The heating is performed under normal atmospheric conditions or at a reduced pressure of for example from several mbars to about $10^{-3}$ mbar.

Heating produces a number of effects. Prior to heating, the layer of the deposited silver-containing nanoparticles may be electrically insulating or with very low electrical conductivity, but heating results in an electrically conductive layer composed of annealed silver-containing nanoparticles which increases the conductivity. In embodiments, the annealed silver-containing nanoparticles may be coalesced or partially coalesced silver-containing nanoparticles. In embodiments, it may be possible that in the annealed silver-containing nanoparticles, the silver-containing nanoparticles achieve sufficient particle-to-particle contact to form the electrically conductive layer without coalescence.

Heating may cause separation of the stabilizer and the liquid from the silver-containing nanoparticles in the sense that the stabilizer and the liquid are generally not incorporated into the electrically conductive layer but if present are in residual quantities. In embodiments, heating may decompose a portion of the stabilizer to produce "decomposed stabilizer." Heating may also cause separation of the decomposed stabilizer such that the decomposed stabilizer generally is not incorporated into the electrically conductive layer, but if present is in a residual amount. Separation of the stabilizer, the liquid, and the decomposed stabilizer from the silver-containing nanoparticles may lead to enhanced electrical conductivity of the resulting electrically conductive layer since the presence of these components may reduce the extent of silver-containing nanoparticle to silver-containing nanoparticle contact or coalescence. Separation may occur in any manner such as for example a change in state of matter from a solid or liquid to a gas, e.g., volatilization.

In embodiments, one or more of the stabilizer, decomposed stabilizer, and the liquid is absent from the electrically conductive layer. In embodiments, a residual amount of one or more of the stabilizer, decomposed stabilizer, and the liquid may be present in the electrically conductive layer, where the residual amount does not appreciably affect the conductivity of the electrically conductive layer. In embodiments, the residual amount of one or more of the stabilizer, decomposed stabilizer, and the liquid may decrease the conductivity of the electrically conductive layer but the resulting conductivity is still within the useful range for the intended electronic device. The residual amount of each component may independently range for example of up to about 5% by weight, or less than about 0.5% by weight based on the weight of the electrically conductive layer, depending on the process conditions such as heating temperature and time. When heating causes separation of the stabilizer and/or decomposed stabilizer from the silver-containing nanoparticles, the attractive force between the separated stabilizer/decomposed stabilizer and the silver-containing nanoparticles is severed or diminished. Other techniques such as exposure to UV radiation, microwave radiation, or IR radiation may be used or combined with thermal heating to accelerate the separation of the liquid and the stabilizer (and/or the decomposed stabilizer) from the silver-containing nanoparticles.

In embodiments, after heating, the resulting electrically conductive layer has a thickness ranging for example from about 5 nanometers to about 5 millimeters, preferably from about 10 nanometers to about 1000 micrometers.

The conductivity of the resulting silver-containing element produced by heating the deposited silver-containing nanoparticle composition is for example more than about 0.1 Siemens/centimeter ("S/cm"), more than about 100 S/cm, more than about 500 S/cm, more than about 2,000 S/cm, more than about 5,000 S/cm, more than about 10,000 S/cm, and more than about 20,000 S/cm as measured by four-probe method.

The resulting conductive elements can be used as conductive electrodes, conductive pads, conductive traces, conductive lines, conductive tracks, and the like in electronic devices. The phrase "electronic device" refers to macro-, micro- and nano-electronic devices such as thin film transistor, organic light emitting diodes, RFID tags, photovoltaic, and other electronic devices which require conductive elements or components.

In embodiments, the advantages of the present chemical method for preparing silver-containing nanoparticles are one or more of the following: (i) single phase synthesis (where the silver compound, the stabilizer, and the solvent form a single phase) without the need for a surfactant; (ii) short reaction time; (iii) low reaction temperatures of below about 100° C.; (iv) uniform particle size and narrow particle size distribution; (v) stable silver-containing nanoparticle composition which can be easily processed by liquid deposition techniques; (vi) relatively inexpensive starting materials;

and (vii) suitable for large-scale production that would significantly lower the cost of silver-containing nanoparticles.

In embodiments, the silver-containing nanoparticle composition can be used in for example, but not limited to, fabricating conductive components such as source and drain electrodes in thin film transistor ("TFT").

Figure 1:
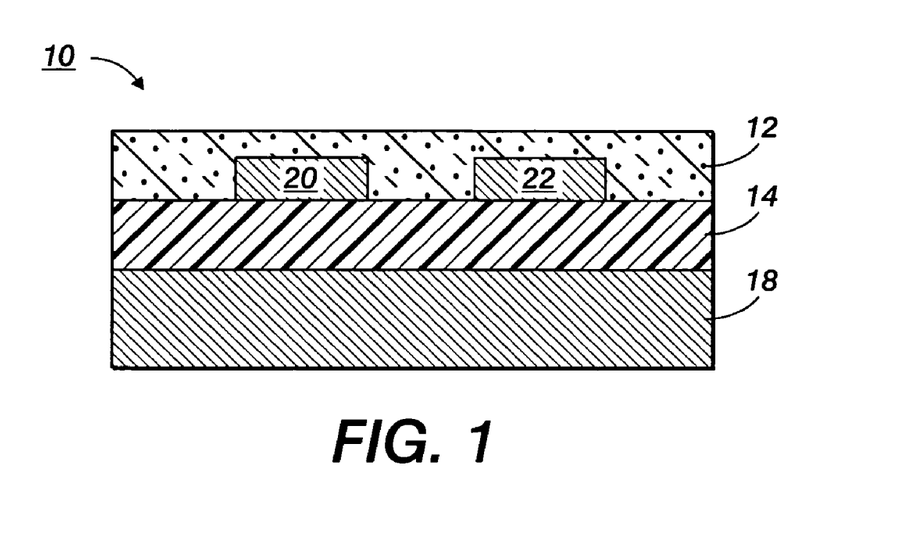
FIG. 1 represents a first embodiment of a thin film transistor wherein the conductive layers were made using the present silver-containing nanoparticles.

In FIG. 1, there is schematically illustrated a TFT configuration 10 comprised of a heavily n-doped silicon wafer 18 which acts as both a substrate and a gate electrode, a thermally grown silicon oxide insulating layer 14 on top of which are deposited two metal contacts, source electrode 20 and drain electrode 22. Over and between the metal contacts 20 and 22 is an organic semiconductor layer 12.

Figure 2:
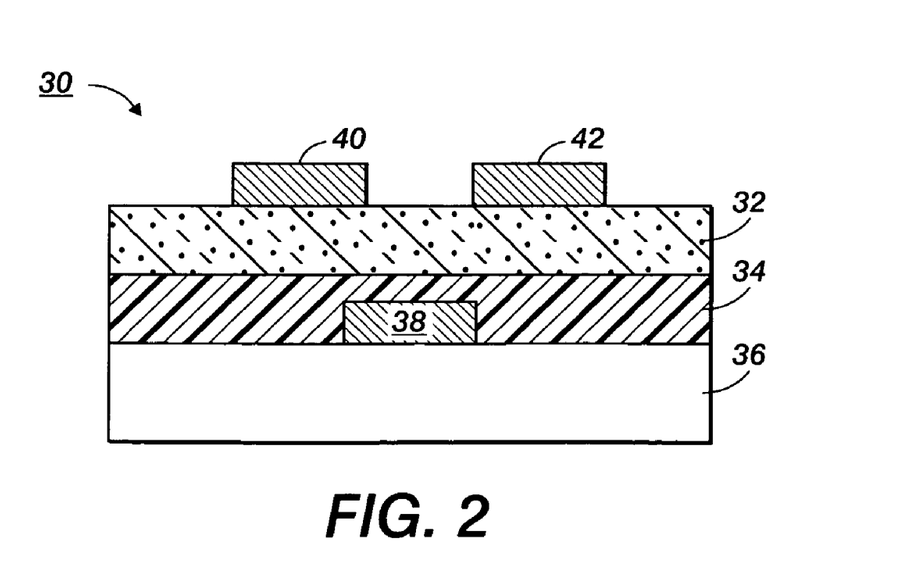
FIG. 2 represents a second embodiment of a thin film transistor wherein the conductive layers were made using the present silver-containing nanoparticles.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
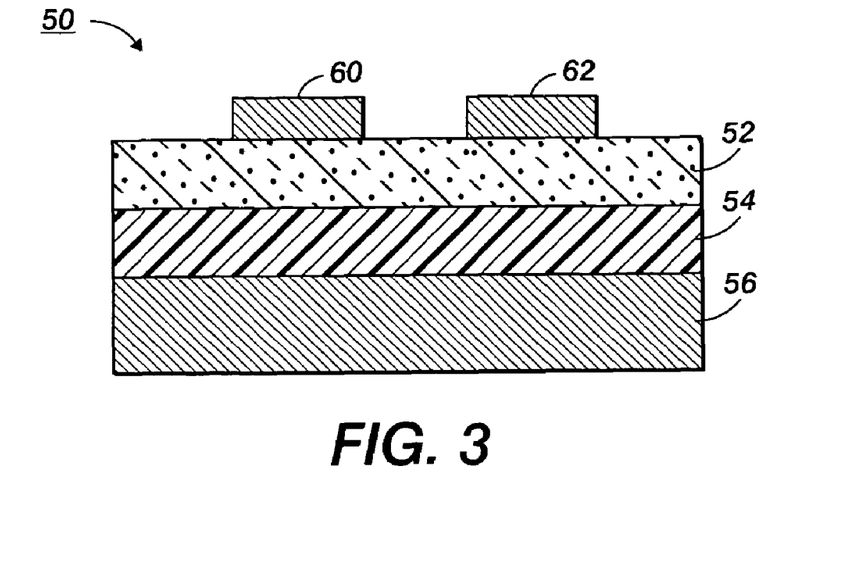
FIG. 3 represents a third embodiment of a thin film transistor wherein the conductive layers were made using the present silver-containing nanoparticles.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
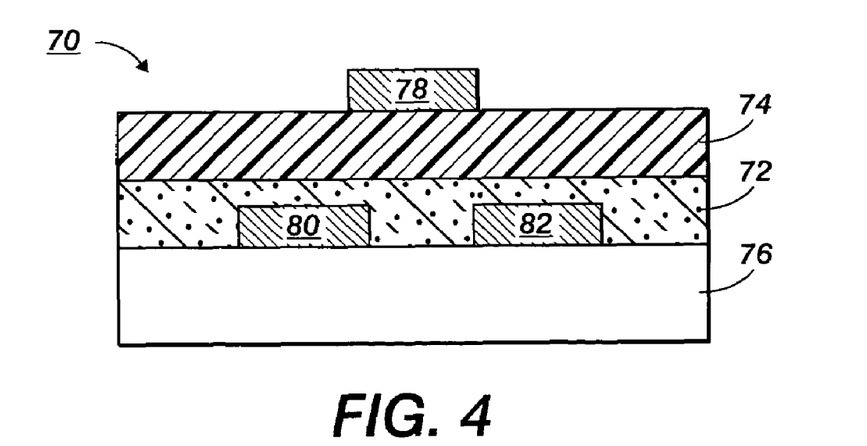
FIG. 4 represents a fourth embodiment of a thin film transistor wherein the conductive layers were made using the present silver-containing nanoparticles.

FIG. 4 schematically illustrates an additional TFT configuration 70 comprised of substrate 76, a gate electrode 78, a source electrode 80, a drain electrode 82, an organic semiconductor layer 72, and an insulating layer 74.

The substrate may be composed of for instance silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and the drain electrode are fabricated by embodiments of the present invention. The thickness of the gate electrode layer ranges for example from about 10 to about 2000 nm. Typical thicknesses of source and drain electrodes are, for example, from about 40 nm to about 1 micrometer with the more specific thickness being about 60 to about 400 nm.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular poly- thiophene, oligthiophene, pentacene, and the semiconductor polymers disclosed in Beng Ong et al., U.S. patent application Publication No. US 2003/0160230 A1; Beng Ong et al., U.S. patent application Publication No. US 2003/0160234 A1; Beng Ong et al., U.S. patent application Publication No. US 2003/0136958 A1; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. Room temperature refers to a temperature ranging for example from about 20 to about 25 degrees C.

EXAMPLE 1

Silver acetate (0.167 g, 1 mmol) and 1-dodecylamine (3.71 g, 20 mmol) were first dissolved in toluene (100 mL) by heating at 60° C. until silver acetate was dissolved. To this solution was added a solution of phenylhydrazine (0.43 g, 4 mmol) in toluene (50 mL) with vigorous stirring over a period of 10 min. The resulting reaction mixture was stirred at 60° C. for 1 hr before cooling down to room temperature. Subsequently, acetone (10 mL) was added to the reaction mixture to destroy excess phenylhydrazine. Solvent removal from the reaction mixture gave a residue which was added to stirring methanol (100 mL) to precipitate the crude silver nanoparticle products. The crude silver nanoparticle product was isolated by centrifugation, washed with acetone twice, and air-dried. It was then dispersed in cyclohexane (2 mL) to form a dispersion of silver nanoparticles in cyclohexane (with molecules of the 1-dodecylamine stabilizer on the surface of the silver nanoparticles). This dispersion was suitable for fabricating conductive elements for electronic devices.

To form a conductive thin film for conductivity measurement, the dispersion of silver nanoparticles in cyclohexane (with the 1-dodecylamine stabilizer) was spin-coated on a glass substrate to form a brownish thin film. The latter was heated on a hot plate at about 120° C. under ambient conditions, a shiny silver film formed immediately upon heating. The thin-film conductivity of the resulting silver film was about 23,000 S/cm as calculated from the measurements using the conventional four-probe technique.

EXAMPLE 2

Silver acetate (0.167 g, 1 mmol) and 1-hexadecylamine (4.83 g, 20 mmol) were first dissolved in toluene (100 mL) by heating at 60° C. until silver acetate was dissolved. To this solution was added a solution of phenylhydrazine (0.43 g, 4 mmol) in toluene (50 mL) with vigorous stirring over a period of 10 min. The resulting reaction mixture was stirred at 60° C. for 1 hr before cooling down to room temperature. Subsequently, acetone (10 mL) was added to the reaction mixture to destroy excess phenylhydrazine. Solvent removal from the reaction mixture gave a residue which was added to stirring methanol (100 mL) to precipitate the crude silver nanoparticle product. The crude silver nanoparticle product was isolated by centrifugation, washed with acetone twice, and air-dried. It was the dispersed in cyclohexane (2 mL) to form a dispersion of silver nanoparticles in cyclohexane (with molecules of the 1-hexadecylamine stabilizer on the surface of the silver nanoparticles). This dispersion was suitable for fabricating conductive elements for electronic devices.

To form a conductive thin film for conductivity measurement, the dispersion of silver nanoparticles in cyclohexane (with the 1-hexadecylamine stabilizer) was spin-coated on a glass substrate to form a brownish thin film. The latter was heated on a hot plate at about 160° C. under ambient conditions, a shiny silver film formed immediately upon heating. The thin-film conductivity of the silver film was about 26,000 S/cm as calculated from the measurements using the conventional four-probe technique.

EXAMPLE 3

Silver acetate (0.167 g, 1 mmol) and 1-dodecylamine (3.71 g, 20 mmol) were first dissolved in toluene (100 mL) by heating at 60° C. until silver acetate was dissolved. To this solution was added a solution of benzoic hydrazide (benzoylhydrazine) (0.54 g, 4 mmol) in toluene (50 mL) with vigorous stirring over a period of 10 min. The resulting reaction mixture was stirred at 60° C. for 1 hr before cooling down to room temperature. Subsequently, acetone (10 mL) was added to the reaction mixture to destroy excess benzoic hydrazide. Solvent removal from the reaction mixture gave a residue which was added to methanol (100 mL) with stirring to precipitate crude silver nanoparticle product. The crude silver nanoparticle product was isolated by centrifugation, washed with acetone twice, and air-dried. It was dispersed in cyclohexane (2 mL) to form a dispersion of silver nanoparticles in cyclohexane (with molecules of the 1-dodecylamine stabilizer on the surface of the silver nanoparticles). This dispersion was suitable for fabricating conductive elements for electronic devices.

To form a conductive thin film for conductivity measurement, the dispersion of silver nanoparticles in cyclohexane (with the 1-dodecylamine stabilizer) was spin-coated on a glass substrate, and the resulting brownish film was heated on a hot plate at about 120° C. for 1.5 hr under ambient conditions, The thin-film conductivity of the resulting silver film was about 15,000 S/cm as calculated from the measurements using the conventional four-probe technique.

EXAMPLE 4

A bottom-contact thin film transistor, as schematically shown by FIG. 1, was chosen to illustrate the use of silver-containing nanoparticle composition as the conductive electrodes of a thin-film transistor. The experimental device was fabricated under ambient conditions, and comprised of an n-doped silicon wafer with a thermally grown silicon oxide layer of a thickness of about 110 nm thereon. The wafer functioned as the gate electrode while the silicon oxide layer acted as the insulating layer and had a capacitance of about 30 nF/cm$^2$ (nanofarads/square centimeter), as measured using a capacitor meter. The silicon wafer was first cleaned with oxygen/argon plasma, isopropanol, air dried, and then immersed in a 0.1 M solution of octyltrichlorosilane in toluene for about 20 min at 60° C. Subsequently, the wafer was washed with toluene, isopropanol and air-dried.

Stencil printing was used to deposit the silver-containing nanoparticle composition on the modified wafer substrate. A stainless stencil with a thickness of 13 μm was positioned on top of the wafer. A dispersion of silver-containing nanoparticle composition of Example 1 in cyclohexane (30 wt %) was then painted through the electrode features of the stencil with a fine paint brush. After drying at room temperature for 1-5 min, the stencil was removed. The printed silver-containing nanoparticle elements were heated at 120° C. on a hotplate under ambient conditions. This resulted in the formation of shiny silver electrodes. Subsequently, a semiconductor layer was deposited on the electroded substrate using the polythiophene semiconductor of the following Formula:

where n is a number of from about 5 to about 5,000. This polythiophene and its preparation are described in Beng Ong et al., U.S. patent application Publication No. US 2003/0160230 A1, the disclosure of which is totally incorporated herein by reference. The semiconductor polythiophene layer of about 30 nm to about 100 nm in thickness was deposited on top of the device by spin coating of the polythiophene in dichlorobenzene solution at a speed of 1,000 rpm for about 100 seconds, and dried in vacuo at 80° C. for 20 hr, followed by annealing in a vacuum oven at 120-140° C. for 10-30 min to induce high structural orders of the semiconductor.

The evaluation of field-effect transistor performance was accomplished in a black box at ambient conditions using a Keithley 4200 SCS semiconductor characterization system. The carrier mobility, μ, was calculated from the data in the saturated regime (gate voltage, $V_G$<source-drain voltage, $V_{SD}$) accordingly to equation (1)

$$I_{SD} = C_i \mu (W/2L)(V_G - V_T)^2 \qquad (1)$$

where $I_{SD}$ is the drain current at the saturated regime, W and L are, respectively, the semiconductor channel width and length, $C_i$ is the capacitance per unit area of the insulating layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0. An important property for the thin film transistor is its current on/off ratio, which is the ratio of the saturation source-drain current in accumulation regime over the current in depletion regime.

The inventive device prepared in this manner showed very good output and transfer characteristics. The output characteristics showed no noticeable contact resistance, very good saturation behaviour, clear saturation currents which are quadratic to the gate bias. The device turned on at around zero gate voltage with a sharp subthreshold slope. Mobility was calculated to be 0.08 cm$^2$/V.s, and the current on/off ratio was about 10$^6$-10$^7$. The performance of the inventive device was essentially the same as that of a conventional bottom-contact TFT with vacuum deposited silver electrodes.

The invention claimed is:

1. A process comprising: reacting a silver compound with a reducing agent comprising a hydrazine compound in the presence of a thermally removable stabilizer in a reaction mixture comprising the silver compound, the reducing agent, the stabilizer, and an organic solvent, to form a plurality of silver-containing nanoparticles with molecules of the stabilizer on the surface of the silver-containing nanoparticles wherein the hydrazine compound is a hydrocarbyl hydrazine, a hydrocarbyl hydrazine salt, a hydrazide, a carbazate, a sulfonohydrazide, or a mixture thereof and wherein the stabilizer includes an organoamine.

2. The process of claim 1, wherein the silver-containing nanoparticles are elemental silver.

3. The process of claim 1, wherein the silver-containing nanoparticles are a silver composite.

4. The process of claim 1, wherein the silver compound, the stabilizer, and the organic solvent form a single phase.

5. The process of claim 1, wherein the organoamine is an alkylamine.

6. The process of claim 1, wherein the hydrazine compound is a hydrocarbyl hydrazine where one nitrogen atom is mono- or di-substituted with R, and the other nitrogen atom is optionally mono- or di-substituted with R, where R is an independently selected hydrocarbon group.

7. The process of claim 1, wherein the hydrazine compound is a hydrazide where one or both nitrogen atoms is substituted by an acyl group of formula RC(O), where each R is independently selected from hydrogen and a hydrocarbon group, and one or both nitrogen atoms are optionally mono- or di-substituted with R', where R' is an independently selected hydrocarbon group.

8. The process of claim 1, wherein the hydrazine compound is a carbazate where one or both nitrogen atoms are substituted by an ester group of formula ROC(O), where R is independently selected from hydrogen and a hydrocarbon group, and one or both nitrogen atoms are optionally mono- or di-substituted with R', where R' is an independently selected hydrocarbon group.

9. The process of claim 1, wherein the hydrazine compound is a sulfonohydrazide where one or both nitrogen atoms are substituted by a sulfonyl group of formula RSO$_2$, where R is independently selected from hydrogen and a hydrocarbon group, and one or both nitrogen atoms are optionally mono- or di-substituted with R', where R' is an independently selected hydrocarbon group.

10. The process of claim 1, further comprising adding to the reaction mixture a scavenger for any excess hydrazine compound.

11. The process of claim 1, wherein the reaction of the silver compound with the reducing agent is carried out at a temperature from about −50° C. to about 200° C.

12. A process comprising:
   (a) reacting a silver compound with a reducing agent comprising a hydrazine compound in the presence of a thermally removable stabilizer in a reaction mixture comprising the silver compound, the reducing agent, the stabilizer, and an organic solvent, to form a plurality of silver-containing nanoparticles with molecules of the stabilizer on the surface of the silver-containing nanoparticles wherein the hydrazine compound is a hydrocarbyl hydrazine, a hydrocarbyl hydrazine salt, a hydrazide, a carbazate, a sulfonohydrazide, or a mixture thereof and wherein the stabilizer includes an organoamine;
   (b) isolating the plurality of silver-containing nanoparticles with the molecules of the stabilizer on the surface of the silver-containing nanoparticles; and
   (c) preparing a composition including a liquid and the plurality of silver-containing nanoparticles with molecules of the stabilizer on the surface of the silver-containing nanoparticles.

13. A process comprising:
   (a) depositing a composition comprising a liquid and a plurality of silver-containing nanoparticles with a stabilizer on a substrate by a liquid deposition technique to form a deposited composition, wherein the silver-containing nanoparticles are obtained by reacting a silver compound with a reducing agent comprising a hydrazine compound in the presence of a thermally removable stabilizer in a reaction mixture comprising the silver compound, the reducing agent, the stabilizer, and an organic solvent wherein the hydrazine compound is a hydrocarbyl hydrazine, a hydrocarbyl hydrazine salt, a hydrazide, a carbazate, a sulfonohydrazide, or a mixture thereof and wherein the stabilizer includes an organoamine; and
   (b) heating the deposited composition to form an electrically conductive layer comprising silver.

14. The process of claim 13, wherein the depositing the composition is accomplished by printing.

15. The process of claim 13, wherein the depositing the composition is accomplished by coating.

16. The process of claim 13, wherein the heating is accomplished at a temperature below about 250 degree C.

17. The process of claim 13, wherein the heating is accomplished at a temperature below about 150 degree C.

18. The process of claim 13, wherein the electrically conductive layer has a conductivity of more than about 0.1 S/cm.

19. The process of claim 13, wherein the electrically conductive layer has a conductivity of more than about 100 S/cm.

20. The process of claim 13, wherein the electrically conductive layer has a conductivity of more than about 2,000 S/cm.

21. The process of claim 13, wherein the electrically conductive layer has a conductivity of more than about 20,000 S/cm.

* * * * *

UNITED STATES PATENT AND TRADEMARK OFFICE
CERTIFICATE OF CORRECTION

PATENT NO.         : 7,270,694 B2                                                           Page 1 of 1
APPLICATION NO.    : 10/958937
DATED              : September 18, 2007
INVENTOR(S)        : Yuning Li et al.

It is certified that error appears in the above-identified patent and that said Letters Patent is hereby corrected as shown below:

In the Specification

Column 1, line 8, after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*